United States Patent [19]
Hori et al.

[11] Patent Number: 5,637,894
[45] Date of Patent: Jun. 10, 1997

[54] SOLID STATE IMAGE SENSOR DEVICE WITH SINGLE-LAYERED TRANSFER ELECTRODES

[75] Inventors: Masako Hori, Yokohama; Masaaki Ogawa, Sagamihara; Hidenori Shibata; Yoshiyuki Shioyama, both of Kawasaki; Yutaka Koshino, Yokohama, all of Japan

[73] Assignee: Kabushiki Kaisha Toshiba, Kawasaki, Japan

[21] Appl. No.: 544,834

[22] Filed: Oct. 18, 1995

[30] Foreign Application Priority Data

Oct. 19, 1994 [JP] Japan .................................. 6-253806

[51] Int. Cl.⁶ .............................................. H01L 27/148
[52] U.S. Cl. .......................... 257/249; 257/250; 257/432; 257/435; 257/448
[58] Field of Search ................................. 257/222, 232, 257/234, 249, 250, 294, 432, 435, 448, 457, 459, 752

[56] References Cited

U.S. PATENT DOCUMENTS 5,463,232  10/1995  Yamashita et al. .................... 257/223

FOREIGN PATENT DOCUMENTS 6-97410  4/1994  Japan ............................ 257/249

*Primary Examiner*—Minh-Loan Tran
*Attorney, Agent, or Firm*—Finnegan, Henderson, Farabow, Garrett & Dunner, L.L.P.

[57] ABSTRACT

A charge coupled device, together with a method for manufacturing the device, is provided which can eliminate a conventional problem, that is, the remaining of a light-receiving film at a great step area and a consequent lowering of a sensitivity resulting from the shutting-off of a portion of incident light. In the charge coupled device, insulating areas are formed in substantially strip-like array on a silicon substrate. Respective transfer electrodes are formed on a gate insulating film on a semiconductor substrate with an insulating areas interposed. The respective phase transfer electrodes are electrically separated by the insulating area. By doing so, the respective phase transfer electrodes can be formed on the same plane without leaving a greater step. This can achieve a thinned light shielding film.

3 Claims, 5 Drawing Sheets

SOLID STATE IMAGE SENSOR DEVICE WITH SINGLE-LAYERED TRANSFER ELECTRODES

BACKGROUND OF THE INVENTION

1. Field of the Invention

The present invention relates to a solid state image sensor device and a method of manufacturing the same, which are used for a CCD (charge coupled device) in particular.

2. Description of the Related Art

Conventionally, a photocell section of a CCD comprises, as shown in, for example, FIG. 10, an Si substrate 101, a gate insulating film 102, a first-layer electrode 103, an insulating interlayer 104, a second-layer electrode 105, a second insulating interlayer 106, a light shielding film (layer) 107, a planarized layer 108, and microlens 109. Incident light is condensed by the microlens 109 and received at a light-receiving portion.

In the manufacture of the CCD thus arranged, a material, such as a polysilicon, for a first-layer electrode is deposited on a gate insulating film 102. The first-layer electrode's material is patterned with a patterned resist, not shown, as a mask to provide a first-layer electrode 103 (see FIG. 11A).

The surface area of the first-layer electrode 103 is oxidized to provide an insulating film 104 of the order of 0.2 μm. Thereafter, a second-layer electrode's material is deposited on a surface. The second-layer electrode's material is etched with the use of a patterned resist, not shown, as a mask to provide a second-layer electrode 105 (see FIG. 11B).

In the CCD structure above, the first-layer electrode 103 and second-layer electrode 105 are stacked in a cross-section taken along a line X—X. That is, in the conventional CCD structure, as shown in FIG. 10, the first-layer electrode 103 and second-layer electrode 105 are nearly fully superimposed as shown in FIG. 10 to minimize an electrode-to-electrode distance.

Since, however, a stacked structure of the first-layer and second-layer electrodes 103 and 105 has a greater step at its edge portion, the light shielding film 107 has to be adequately thickened so as to cover the side wall portions of the first-layer and second-layer electrode 103 and 105. The light shielding film 107, being not required at some part, is removed at a later step. In the case of the light shielding film 107 being thick, it will be difficult to fully remove the light shielding film 107. There is a disadvantage that part of the light shielding film 107 is left in particular at a great step in an etching process.

Further, if the light shielding film 107 is thickened, it shields part of an optical path of incident light condensed at the microlens 109, thus lowering the sensitivity of the device.

In the conventional device, as set out above, the greater step is provided at the edge portion of the stacked structure of the first-layer and second-layer electrodes 103 and 105. This necessitates thickening the light shielding film 107 and there arises the problem with the remaining of the light shielding film at the etching step and the consequent reduced sensitivity.

SUMMARY OF THE INVENTION

It is accordingly the object of the present invention to provide a solid state image sensor device, and a method for manufacturing the same, which can achieve less liability of a light shielding film to be left as a residual etching portion and prevent a lowering in its light sensitivity.

According to an aspect of the present invention, there is provided a solid state image sensor device comprising: a semiconductor substrate; a plurality of transfer electrodes formed over the semiconductor substrate on a common plane; and insulating areas by which the transfer electrodes are electrically separated from each other.

According to another aspect of the present invention, there is provided a solid state image sensor device comprising: a semiconductor substrate; a plurality of insulating areas formed on the semiconductor substrate; an insulating film formed on the semiconductor substrate and between the insulating areas; and a plurality of transfer electrodes each formed on the insulating film and between the insulating areas, wherein the respective transfer electrodes are electrically separated by the insulating areas from each other on a common plane over the semiconductor substrate.

According to a further aspect of the present invention a method of manufacturing a solid state image sensor device is provided which comprises the steps of: a method for manufacturing a solid state image sensor device comprising the steps of: forming an insulating layer on a semiconductor substrate; forming a plurality of insulating areas by selectively eliminating the insulating layer; forming an insulating film on the semiconductor substrate and between the insulating areas; and forming a plurality of transfer electrodes each on the insulating film and between the insulating areas; wherein the transfer electrodes are electrically isolated from each other, by the insulating areas, on a common plane over the semiconductor substrate.

According to a still further aspect of the present invention, there is provided a solid state image sensor device comprising: a semiconductor substrate; a gate insulating film formed on the semiconductor substrate; a plurality of transfer electrodes formed on a common plane over the semiconductor substrate, with the gate insulating film interposed; and insulating areas each formed between the transfer electrodes.

According to the present invention it is possible to achieve a thin light shielding film which might not otherwise be attained in a conventional stacked layer structure due to a greater step being left between its first- and its second-layer electrode as set out above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The embodiments of the present invention will be explained below with reference to the accompanying drawings.

Figure 1A:
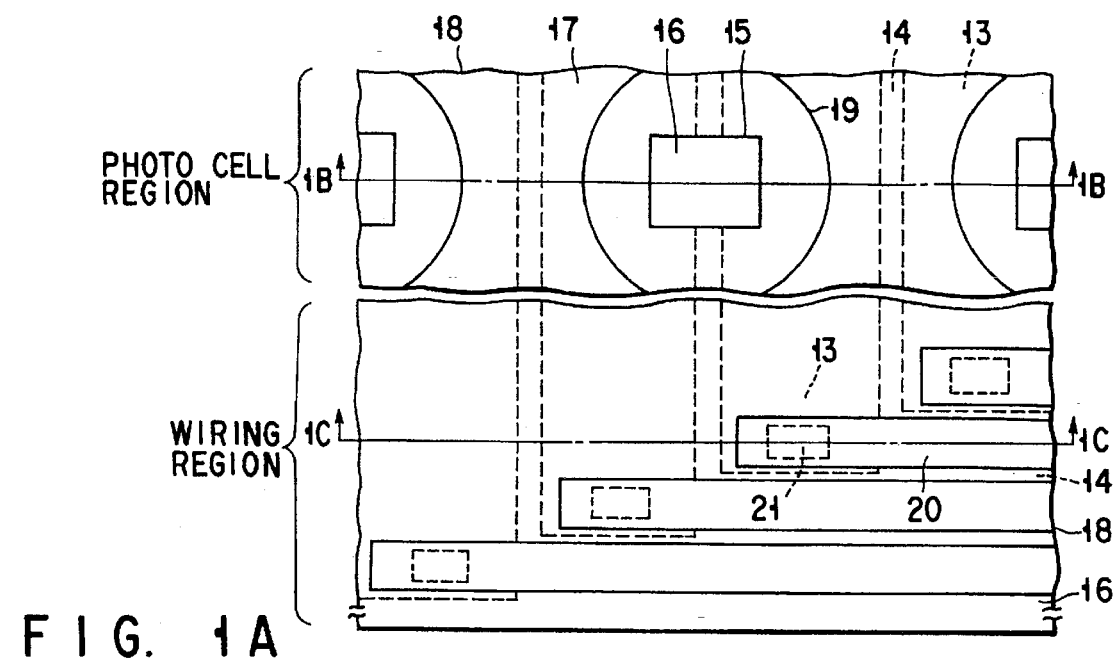
FIG. 1A is a plan view diagrammatically showing a major portion of a charge coupled device (CCD) according to one embodiment of the present invention.
Figure 1B:
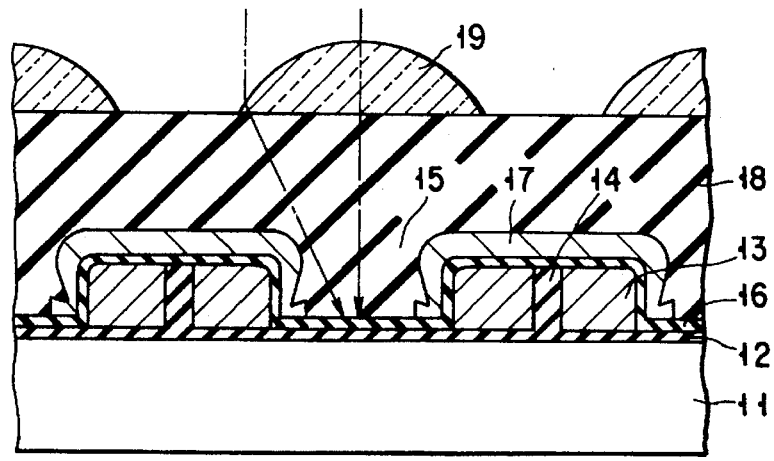
FIG. 1B is a cross-sectional view, taken along line IB—IB in FIG. 1A.
Figure 1C:
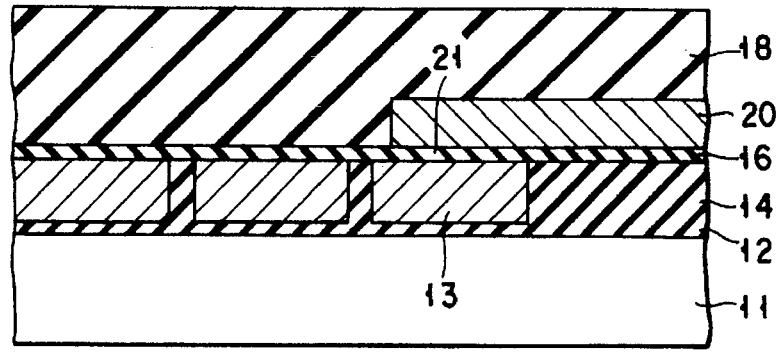
FIG. 1C is a cross-sectional view, taken along line IC—IC in FIG. 1A.

FIGS. 1A, 1B and 1C diagrammatically show a charge coupled device (CCD) of the present invention, FIG. 1A being a plan view showing a major portion of the charge coupled device, FIG. 1B being a cross-sectional view taken along line IB—IB in the charge coupled device and FIG. 1C being a cross-sectional view taken along line IC—IC in the charged coupled device in FIG. 1A.

In the charge coupled device, a plurality of transfer electrodes 13 are formed over a semiconductor, for example silicon, substrate 11 with a gate insulating film 12 interposed between the transfer electrodes 13 and the substrate 11. That is, the transfer electrodes 13 are located on a common or the same plane over the substrate 11. The transfer electrodes 13 are electrically insulated from each other by an insulating area 14 formed on the silicon substrate 11.

In a photocell section of the charge coupled device, an opening 15 is provided for forming a light-receiving area, a light shielding film (layer) 17 is provided for covering a side wall of the insulating area 14 through an interposed interlayer 16 and a microlens 19 is provided for condensing incident light to the light-receiving area via a planarized layer 18.

In a wiring section of the charge coupled device, a wiring layer 20, such as aluminum, is formed on an insulating interlayer 16 and connected via a contact hole 21 to a corresponding one of the transfer electrodes 13. The upper side of the respective wiring 20 is covered with the planarized layer 18.

An set out above, the transfer electrodes 13 are provided with the interposed insulating area 14. That is, the transfer electrodes 13 are provided on the same plane, a structure which is different from the conventional two-layered electrode structure with a step formed thereon.

Before the formation of the transfer electrodes 13, the insulating areas 14 are provided in substantially strip-like array in accordance with a predetermined spacing between the transfer electrodes 13.

The opening 15 corresponding to the light-receiving area is provided at a photocell formation section by partially removing the insulating area 14 and its adjacent transfer electrode 13 in a way to expose the gate insulating film 12.

In the charge coupled device so arranged, incident light condensed at the microlens 19 is received at the light-receiving area and a signal charge is generated at a corresponding photodiode, not shown, and stored in a semiconductor area below the transfer electrode 13 and taken out of the corresponding wiring layer 20.

A method of manufacturing a charged coupled device as set out above will be explained below.

FIGS. 2 to 8B show the steps of manufacturing the charged coupled device at a photocell section.

Figure 2:
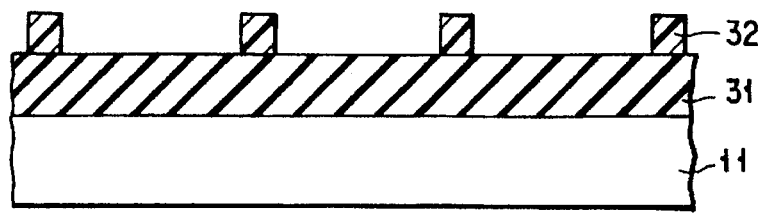
FIG. 2 is a cross-sectional view showing one step of manufacturing the CCD in FIG. 1A.

An insulating layer 31 is formed on a silicon substrate 11 as shown in FIG. 2. The insulating layer 31 is etched with the use of a patterned resist 32 as a mask. The resist 32 is removed after the etching has been effected.

Figure 3A:
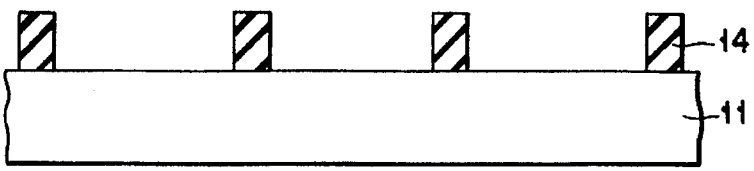
FIG. 3A is a cross-sectional view showing a step of a manufacturing process of the CCD and FIG. 3B is a plan view showing the step of the manufacturing process of FIG. 3A.
Figure 3B:
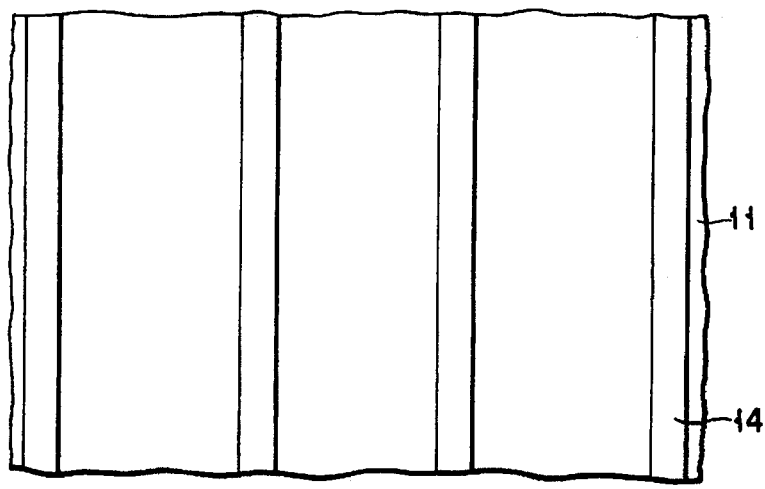

The insulating layer 31 is left at only a gap portion corresponding to each transfer electrode (13) formation area. That is, as shown in FIGS. 3A and 3B, insulating areas 14 are formed in a substantially strip-like array.

Figure 4:
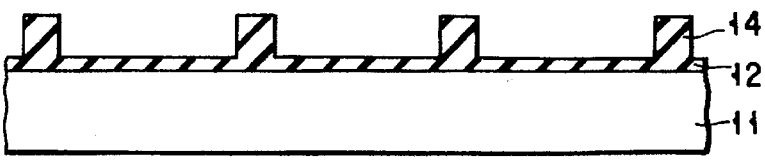
FIG. 4 is a cross-sectional view showing another step of the manufacturing process of the CCD.

As shown in FIG. 4, the surface of the silicon substrate 11 is oxidized to provide gate insulating layers 12 at those surface areas defined between the insulating areas 14.

Figure 5:
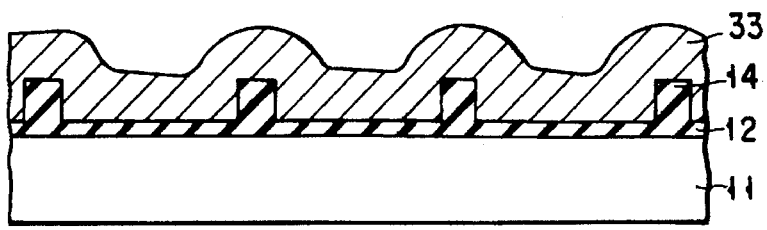
FIG. 5 is a cross-sectional view showing an another step of the manufacturing process of the CCD.

An electrode material 33, such as a polysilicon, is deposited over the silicon substrate 11 as shown in FIG. 5.

Figure 6:
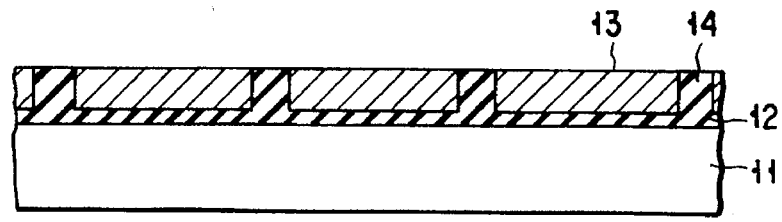
FIG. 6 is a cross-sectional view showing another step of the manufacturing process of the CCD.

As shown in FIG. 6, the electrode material (33) layer deposited on the silicon substrate 11 is polished down to a level corresponding to that of the insulating areas 14 to provide a planarized surface on an upper side. By doing so, transfer electrodes 13 are electrically insulated by the insulating area 14 from each other such that they are formed at the same level over the semiconductor substrate.

Figure 7:
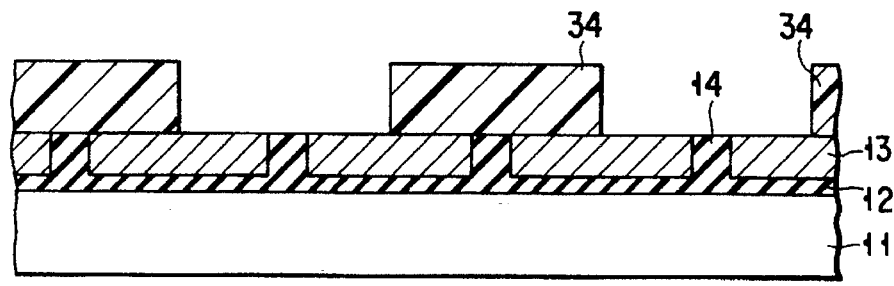
FIG. 7 is a cross-sectional view showing another step of the manufacturing process of the CCD.

In the photocell section, as shown in FIG. 7, patterned resists 34 are formed at selected areas on the transfer electrodes 13 and insulating areas 14 overlying the silicon substrate 11. Using the resists 34 as masks, non-masked areas in the photocell section are etched, followed by the removal of the resists 34 after the etching has been effected.

Figure 8A:
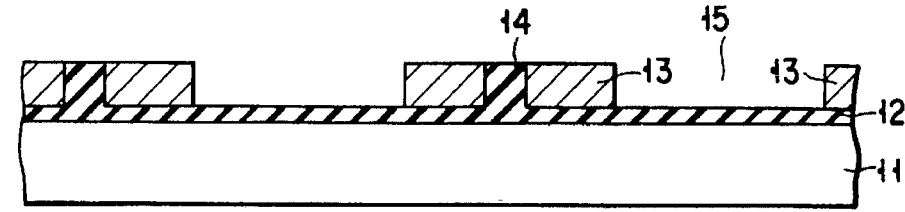
FIG. 8A is a cross-sectional view showing another step of the manufacturing process of the CCD and FIG. 8B is a plan view showing the manufacturing process of FIG. 8A.
Figure 8B:
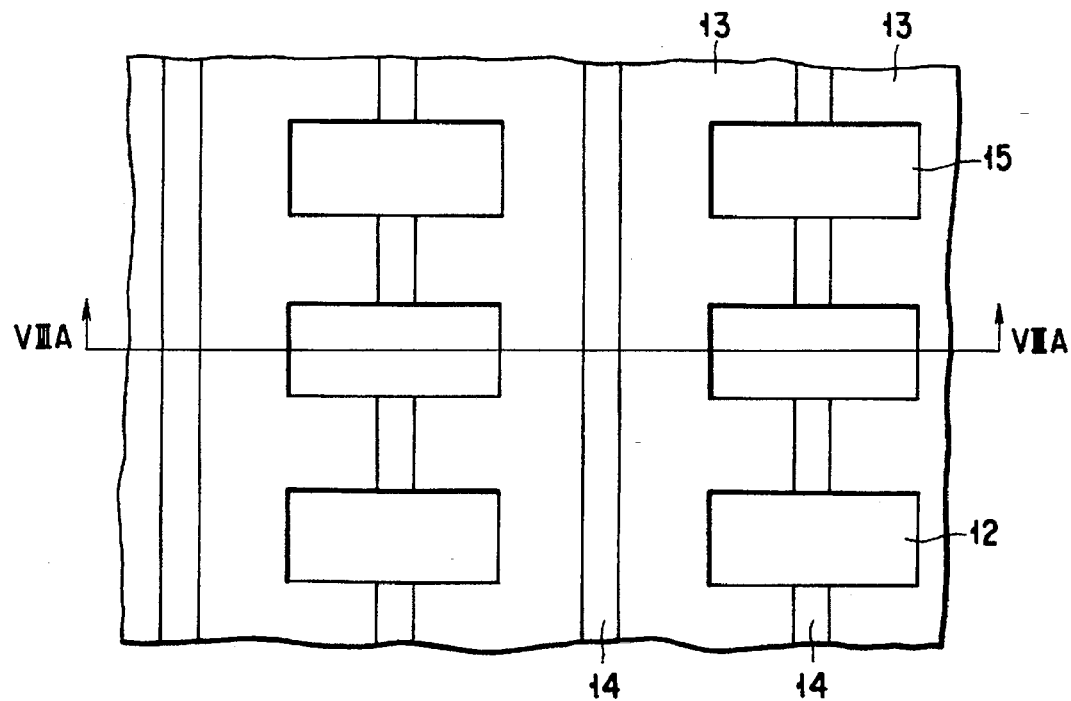

As shown in FIGS. 8A and 8B, openings 15 corresponding to the non-masked areas are selectively provided at the photocell section of the silicon substrate 11. The gate insulating films 12 corresponding to the openings 15 are exposed to provide light-receiving areas.

An interlayer 16 and light shielding film 17 are sequentially formed over the whole surface of the silicon substrate 11. The light shielding film 17 is etched at other than those transfer electrode 13 areas and their side walls, that is, at those areas other than the non-light-receiving areas in the photocell section. Since, in this case, the respective transfer electrodes 13 are formed on the same plane so that any great step which has been encountered on the conventional charge coupled device is not involved, the light shielding film 17 can be made much thinner than the counterpart of the conventional device. That is, according to the present invention it is possible to solve the conventional problem, that is, a problem involving the remaining of some etching area of the light shielding film 17 at a greater step area.

At the wiring section, the insulating interlayer 16 is partially removed to provide a contact hole 21 contacting with the respective transfer electrode 13 and then a wiring layer 20 is formed in that state. When the insulating area 14 is provided to reach the outer marginal area of the element except at the photocell section, it is possible to form the wiring layer 20 on a planar surface and achieve the easiness with which the wiring layer 20 is formed.

A planarized layer 18, such as an oxide film, is formed on the whole surface of the silicon substrate 11 and microlenses 19 are formed on portions of the planarized layer 18 in the photocell section so as to condense incident light at the light-receiving areas. In this way it is possible to provide a charged coupled device as shown in FIG. 1.

According to the present invention, the adjacent transfer electrodes are electrically isolated by the insulating areas and, by doing so, the transfer electrodes can be formed on the same plane without leaving any greater step, thus achieving adequate shielding of light by the thinner light shielding film. It is, therefore, possible to achieve a thinned light shielding film. Therefore it is possible to solve the conventional problem, that is, the remaining of some unetching area at the light shielding film. It is also possible to achieve improved sensitivity.

Since the transfer electrodes are planarized by the polishing of the electrode material, a better operation is ensured in the subsequent manufacturing steps and it is possible to provide the transfer electrodes stably and a high flat level.

Further the charge coupled device can also be made thinner as a whole and the wiring layer 20 can be formed readily so that the simplification of the manufacturing process can be expected.

Figure 9:
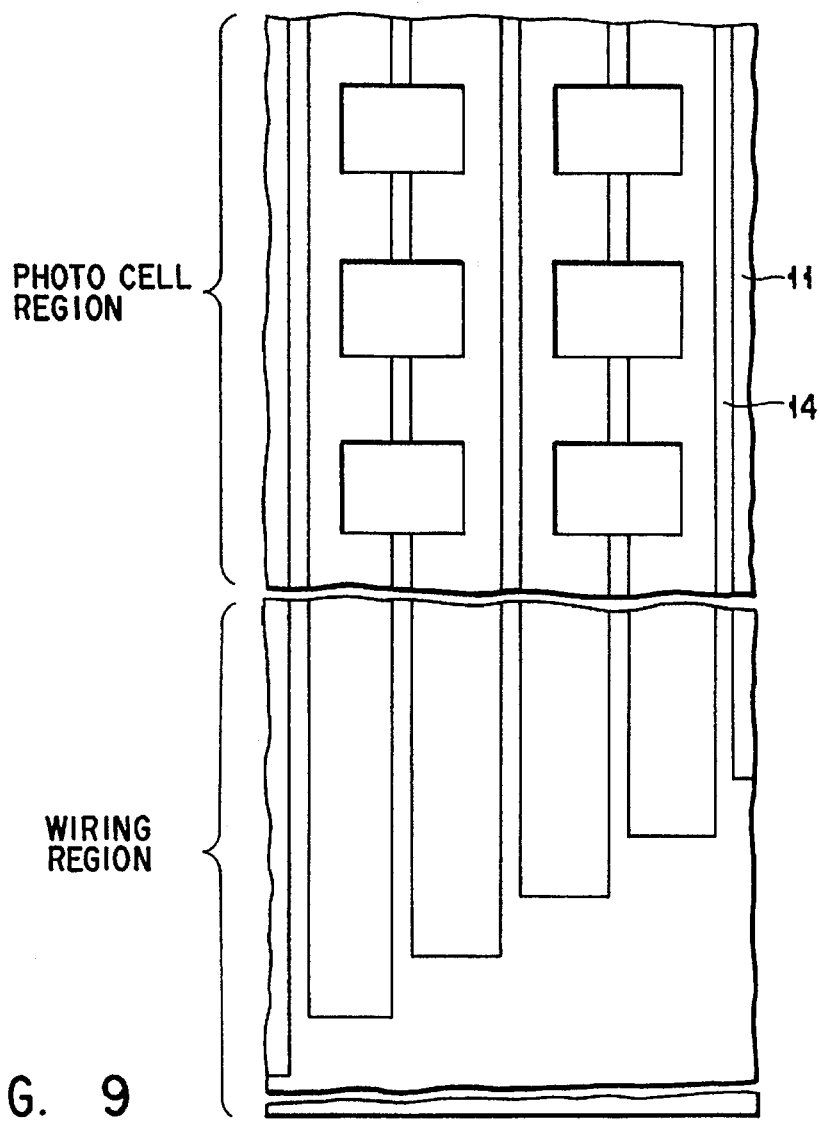
FIG. 9 is a plan view showing one form of a flat pattern of a CCD according to another embodiment of the present invention.
Figure 10:
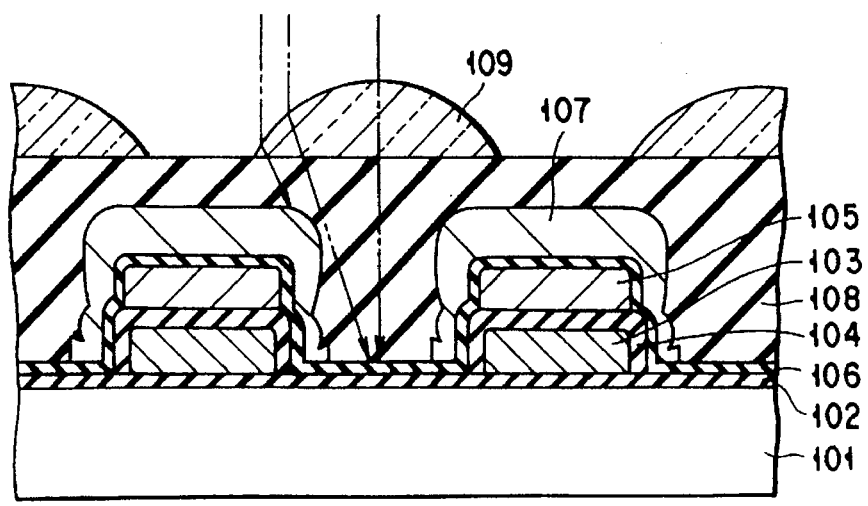
FIG. 10 is a cross-sectional view showing conventional CCD structure for explaining a problem encountered thereon.
Figure 11A:
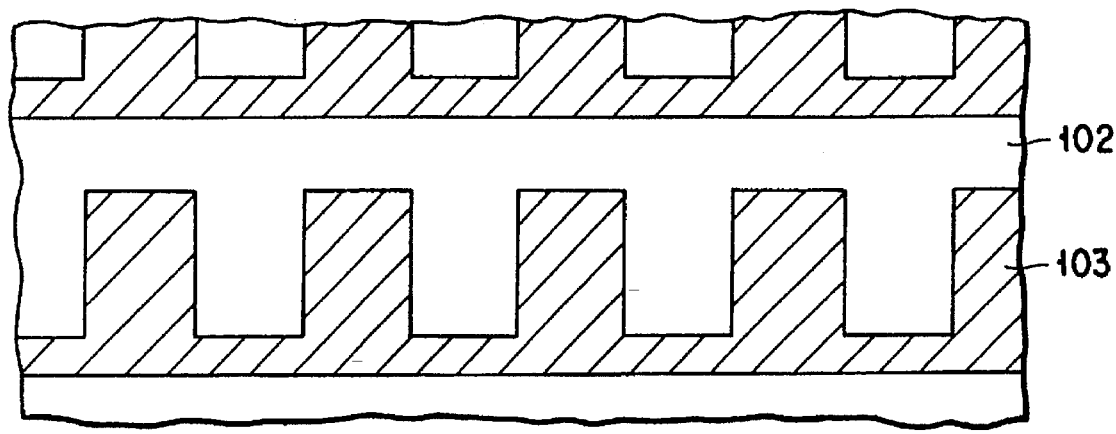
FIG. 11A is a plan view partially showing the CCD structure in the manufacturing process of FIG. 10.
Figure 11B:
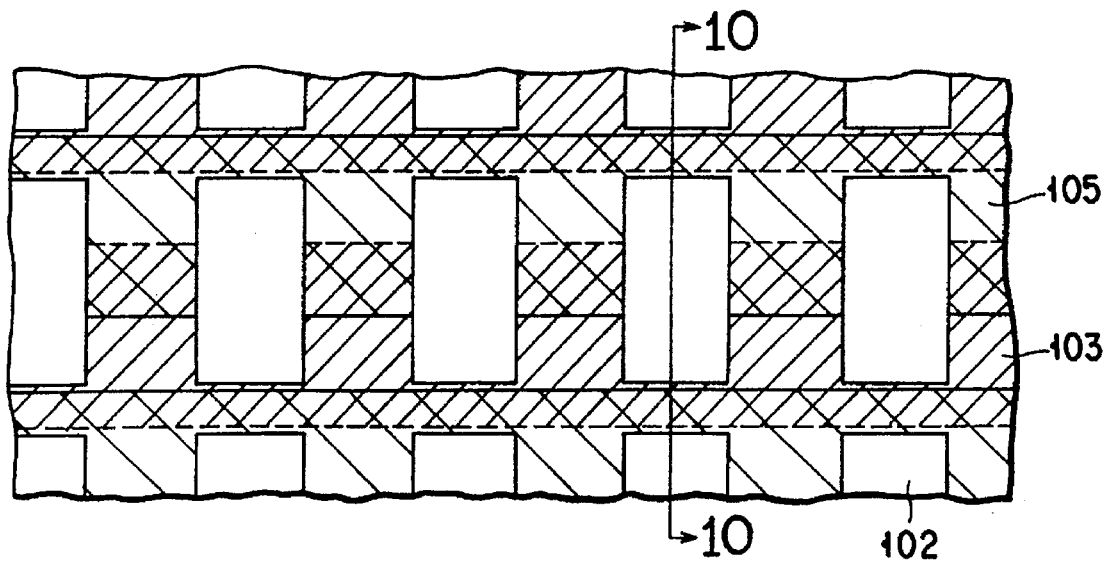
FIG. 11B is a plan view partially showing the CCD structure in the manufacturing process.

Although, in the above-mentioned embodiment, the insulating areas have been explained as being formed in a strip array, the insulating layers 31 may be so selectively left at those gap portions of the transfer electrodes 13 and at those opening 15 formation portions of the light-receiving areas as shown, for example, in FIG. 9.

Even in this case, the insulating areas 14 are so provided as to reach the marginal edge portion of a wiring section except at a photocell section. It is therefore possible to form the wiring layers 20 on a planar surface and easily form the wiring layers 20.

Further, the planarization of the transfer electrodes can be realized not only by the polishing method but also by other proper methods such as depositing a resist on electrode material and eliminating, together with the resist, the electrode material in a reactive ion etching method so long as the method can be etched in substantially the same rate.

Various changes or modifications of the present invention can be made without departing from the spirit and scope of the present invention.

According to the present invention, as set out above in more detail, it is possible to provide a solid state image sensor device, as well as a method for manufacturing the same, which can prevent the remaining of some etching area and involves no reduced sensitivity.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A solid state image sensor device comprising:

a semiconductor substrate having a photocell region and a wiring region;

a first insulating film on said semiconductor substrate, the first insulating film extending over said photocell region and said wiring region;

a plurality of insulating areas on said semiconductor substrate, the insulating areas extending over said photocell region and into said wiring region, said plurality of insulating areas having top surfaces level with each other;

a plurality of transfer electrodes on said first insulating film on a common plane, the transfer electrodes extending over said photocell region and into said wiring region and between said insulating areas, the transfer electrodes having top surfaces level with the top surfaces of said insulating areas; and a second insulating film at least on the top surfaces of said insulating areas and said transfer electrodes.

2. The solid state image sensor device according to claim 1, wherein the insulating areas are formed in a strip-like array in accordance with an interval between the respective transfer electrodes.

3. The solid state image sensor device according to claim 1, wherein the insulating areas are formed in accordance with an interval between the transfer electrodes and an opening shape for creating a light-receiving area.

* * * * *